(12) United States Patent
Shimizu et al.

(10) Patent No.: US 8,129,671 B2
(45) Date of Patent: Mar. 6, 2012

(54) POWER SUPPLY DEPENDENT OPTICAL RECEIVER AND AMPLIFIER AND PHOTOCOUPLER USING THE SAME

(75) Inventors: Masafumi Shimizu, Ohtsu (JP); Shinya Sawamoto, Ohtsu (JP)

(73) Assignee: Renesas Electronics Corporation, Kanagawa (JP)

( * ) Notice: Subject to any disclaimer, the term of this patent is extended or adjusted under 35 U.S.C. 154(b) by 434 days.

(21) Appl. No.: 12/332,793

(22) Filed: Dec. 11, 2008

(65) Prior Publication Data

US 2009/0146739 A1 Jun. 11, 2009

(30) Foreign Application Priority Data

Dec. 11, 2007 (JP) ................................. 2007-319990
Oct. 17, 2008 (JP) ................................. 2008-269013

(51) Int. Cl.
*H03F 3/08* (2006.01)
*G02B 27/00* (2006.01)

(52) U.S. Cl. ..................................... 250/214 A; 250/551

(58) Field of Classification Search .................. 250/206, 250/214 A, 551, 214.1, 214 R, 214 C; 348/300, 348/301; 398/202, 130, 210, 208, 209, 212; 330/308, 307, 297, 127, 199, 200; 327/514, 327/515; 257/290–294

See application file for complete search history.

(56) References Cited

U.S. PATENT DOCUMENTS

| | | | | |
|---|---|---|---|---|
| 5,734,170 A | * | 3/1998 | Ikeda ............................. | 250/551 |
| 5,848,044 A | * | 12/1998 | Taguchi et al. ............ | 369/53.26 |
| 6,456,141 B1 | * | 9/2002 | Nishizono et al. ............ | 327/345 |
| 6,792,013 B2 | * | 9/2004 | Ishiwata et al. ................. | 372/33 |
| 2009/0097289 A1 | * | 4/2009 | Schetters ........................ | 363/84 |

FOREIGN PATENT DOCUMENTS

JP 06-338778 A 12/1994

* cited by examiner

*Primary Examiner* — Que T Le
*Assistant Examiner* — Jennifer Bennett
(74) *Attorney, Agent, or Firm* — Sughrue Mion, PLLC

(57) ABSTRACT

In an optical receiver and amplifier and an optical coupler, a technique for stabilize operations at turning on/off of a power supply by a simple configuration is desired. An optical receiver and amplifier includes: a photodiode generates a photocurrent in response to a light input; an output section outputs output voltage being a low level or a high level in response to a magnitude of the photocurrent by using a power supply voltage supplied from a power supply; and an output control circuit controls an input voltage of the output section such that the output voltage is set to the low level when the power supply is turned on or off during a period where the power supply voltage is lower than a predetermined value. The output voltage can be set to the low level so that an additional circuit for preventing malfunction is not needed.

11 Claims, 14 Drawing Sheets

US 8,129,671 B2

POWER SUPPLY DEPENDENT OPTICAL RECEIVER AND AMPLIFIER AND PHOTOCOUPLER USING THE SAME

INCORPORATION BY REFERENCE

This patent application is based on Japanese Patent Applications No. 2007-319990 and No. 2008-269013. The disclosures of the Japanese Patent Applications are incorporated herein by reference.

BACKGROUND OF THE INVENTION

1. Field of the Invention

The present invention relates to an optical receiver and amplifier, and a photocoupler using the same.

2. Description of Related Art

There is a demand for a photocoupler having an output function as an application for the photocoupler for preventing malfunction of a circuit connected to a subsequent stage of the photocoupler at turn-on or turn-off of a power supply. In one example of the photocoupler where the output follows the power supply (namely, even the supplied power becomes less than a predetermined level, the output does not become completely the off state), a control circuit for preventing malfunction is required to be additionally provided in order to prevent malfunction in subsequent stages of the photocoupler.

In Japanese Laid-Open Patent Application JP-A-Heisei, 6-338778, an example of a photocoupler (a bidirectional photocoupler) is described.

SUMMARY

FIG. 1 shows a configuration of a photocoupler in a reference example for explaining the present invention. The photocoupler 901 in the reference example has a light emitting diode 902 arranged at a signal input side and a photodiode 903 arranged at a signal output side. The photodiode 903 receives light from the light emitting diode 902 and converts the light into a photocurrent which is an electric signal in response to the received light. Since the electric signal is faint, an optical receiver and amplifier (also referred to as an optical detection amplifier or a light receiving amplifier) 904 for amplifying the electric signal and processing the amplified signal is arranged in a subsequent stage of the photodiode 903.

FIG. 2 is a circuit diagram of the optical receiver and amplifier 904 in the reference example. The circuit shown in FIG. 2 has an amplifier 302 to which a feedback resistor R31 is connected. A photodiode 301 as a photoelectric conversion element is connected to an input terminal of the amplifier 302. An output current of the photodiode 301 is converted into a voltage by the feedback resistor R31 of a current/voltage converting IC. The voltage generated through the conversion switches on/off an output transistor Q31. An output Vout is an open collector output and a pull-up resistor R32 is generally used.

When a light input does not exist or is small relative to a certain threshold level, an output of the amplifier 302 is at a low level. That is, since the input to the output transistor Q31 is at the low level, the collector output of the output transistor Q31 is at the high impedance (=off state) and the output Vout is at the same level as the power supply connected via the pull-up resistor R32. FIG. 3A shows relationship between the power supply voltage and the output Vout at this time. Since the output Vout is at the same level as the power supply connected via the pull-up resistor R32 at all times, the output Vout completely follows the power supply as shown in FIG. 3A.

When the light input is large relative to a certain threshold level, the output of the amplifier 302 is at a high level. That is, since the input to the output transistor Q31 is at the high level, the collector output of the output transistor Q31 is at the low impedance (=on state) and the output Vout is at the low level (the collector-emitter voltage at saturation of the output transistor Q31). FIG. 3B shows relationship between the power supply voltage and the output Vout at this time. When the power supply voltage is a voltage V1 shown in the graph of FIG. 3B or higher, the output Vout is at the low level. However, when the power supply voltage is the voltage V1 or lower, as in the case where no light input exists, the voltage follows the power supply. This follow is caused by a fact that the output of the amplifier 302 cannot be at the high level unless the voltage V1 or greater is applied as the power supply voltage, that is, the output of the amplifier 302 is at the low level at a supply voltage of V1 or lower.

There is a demand for a photocoupler having an output function as an application for the photocoupler for preventing malfunction of a circuit connected to a subsequent stage of the photocoupler at turn-on or turn-off of the power supply. Specifically, the function that the output is turned off (=low level) when the power supply is lower than a certain level is demanded. With the configuration and the operation in the above-mentioned reference example, regardless of the presence or absence of the light input, the output of the photocoupler follows the power supply when the power supply level is low and thus, the demand cannot be satisfied. For this reason, a control circuit for preventing malfunction needs to be additionally provided.

Further explanation is given referring to FIGS. 4 and 5. FIG. 4 shows an optical system in which an optical receiver and amplifier 1001 in the reference example shown in FIG. 2 is connected to a logic function block 1003 via an INV 1002. FIG. 5 is a graph showing relationship between an optical receiver and amplifier output Va and an INV output Vb, and the power supply voltage when a light input exists.

When a light input exists, it is required that the input of the logic function block 1003 is at the high level within its prescribed power supply voltage range. As shown in FIG. 5, however, the optical receiver and amplifier output Va in the reference example is at the low level at a certain voltage or higher and follows the power supply at a lower voltage. For this reason, in the case of the INV output Vb, a region where the operation is NG (namely, a region where regular operations can not be expected) in the prescribed power supply voltage range of the logic function block 1003 occurs, which causes malfunction.

Accordingly, the optical system using the optical receiver and amplifier 1001 in the reference example requires a power control circuit 1004 as a control circuit for preventing malfunction. Power supply interconnection of the power control circuit 1004 is distinguished into two lines respectively connected to the optical receiver and amplifier 1001+the INV 1002 and the logic function block 1003. First, a power supply of the optical receiver and amplifier 1001+the INV 1002 is turned on and then, a power supply of the logic function block 1003 is turned on. Thereby, a stable output can be obtained at the start-up of the logic function block 1003.

The inventors of the present invention supposed that it is very desirable from a viewpoint of the client VE if the power control circuit 1004 can be omitted from the device. However, in an optical system having no power control circuit 1004 in the reference example, the optical receiver and amplifier 1001+INV 1002 and the logic function block 1003 are turned on at the same time, causing the above-mentioned disadvantage.

There is a demand for a technique capable of stabilizing operations of an optical receiver and amplifier and a photocoupler at turn-on and turn-off of a power supply with a simple configuration.

In a first aspect of the present invention, an optical receiver and amplifier includes: a photodiode which generates a photocurrent in response to a light input; an output section which outputs output voltage being a low level or a high level in response to a magnitude of the photocurrent by using a power supply voltage supplied from a power supply; and an output control circuit which controls an input voltage of the output section such that the output voltage is set to the low level when the power supply is turned on or off during a period where the power supply voltage is lower than a predetermined value.

According to an optical receiver and amplifier having the above configuration, the output control circuit is able to set the output voltage of the output transistor to the low level irrelevantly to the presence or absence of the light output when the power supply voltage is equal to or lower than a predetermined value (V2). As a result, an additional control circuit for preventing malfunction is not needed.

The present invention provides a technique capable of stabilizing operations of an optical receiver and amplifier and a photocoupler at turn-on and turn-off of the power supply with a simple configuration.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF THE PREFERRED EMBODIMENTS

Hereinafter, an optical receiver and amplifier and photocoupler according to embodiments of the present invention will be described with reference to the attached drawings.

Figure 1:
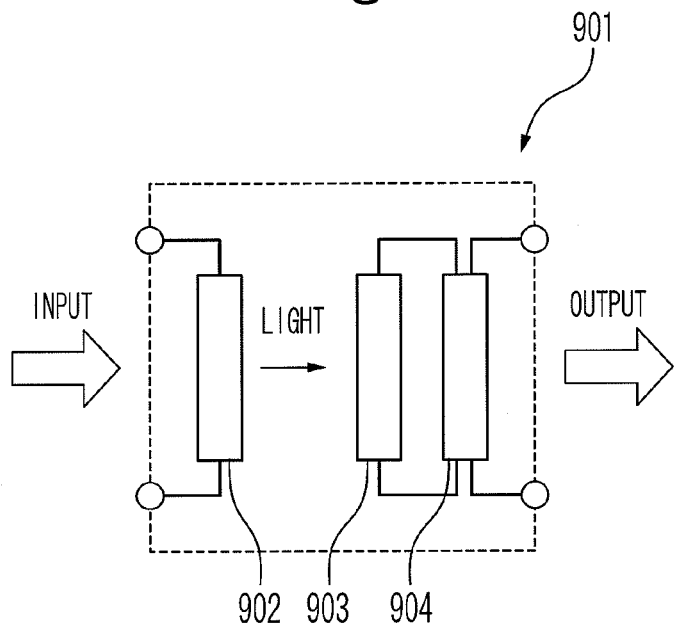
FIG. 1 shows a photocoupler in a reference example.
Figure 2:
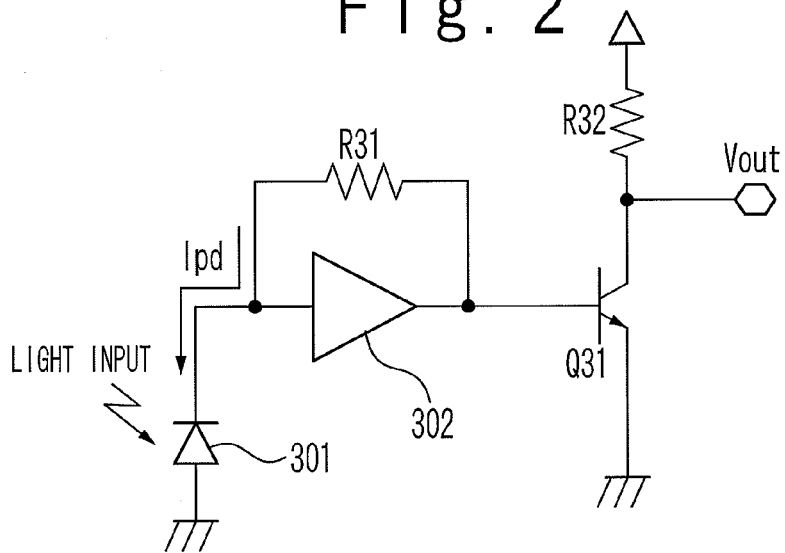
FIG. 2 is a circuit diagram in a reference example.
Figure 3A:
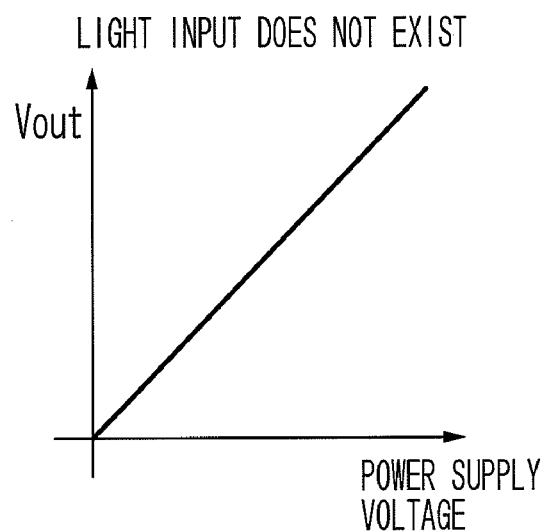
FIG. 3A shows an output characteristic in a reference example.
Figure 3B:
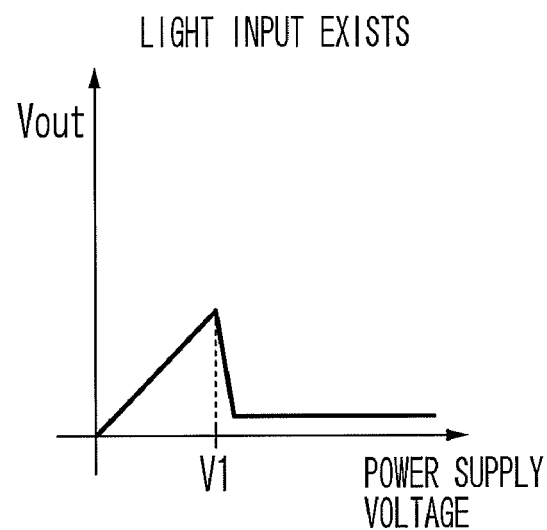
FIG. 3B shows an output characteristic in a reference example.
Figure 4:
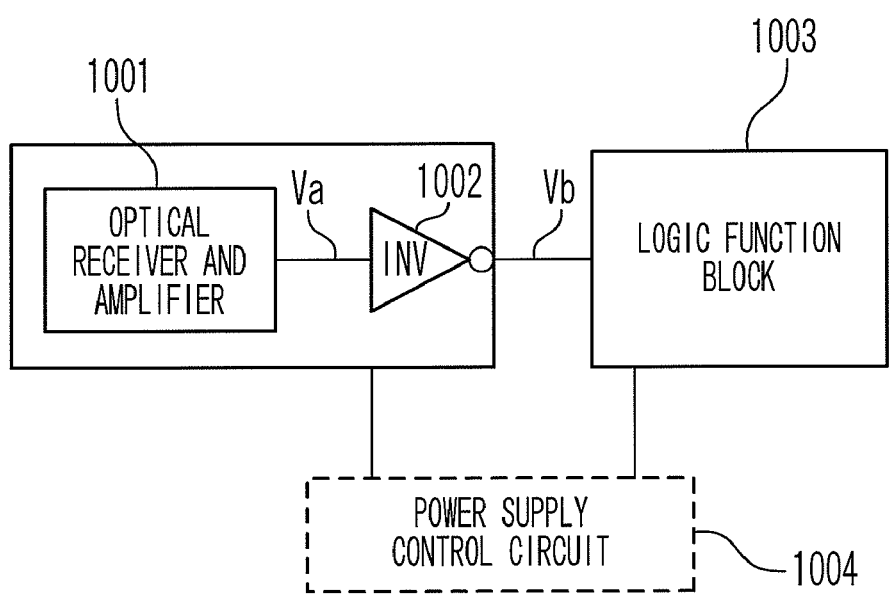
FIG. 4 shows an example of an optical system in a reference example.
Figure 5:
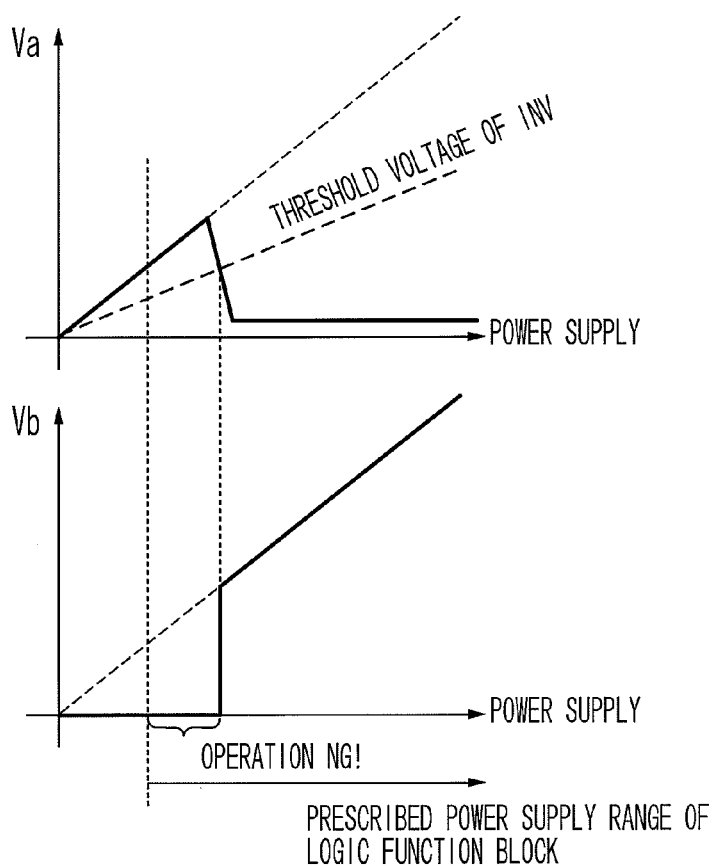
FIG. 5 shows an output characteristic of an optical system in a reference example.

Each embodiment of a photocoupler according to the present invention has a configuration shown in FIG. 1 explained before as a reference example. In the following, configurations of the photodiode and the optical receiver and amplifier in such a photocoupler are explained in detail.

First Embodiment

Figure 6:
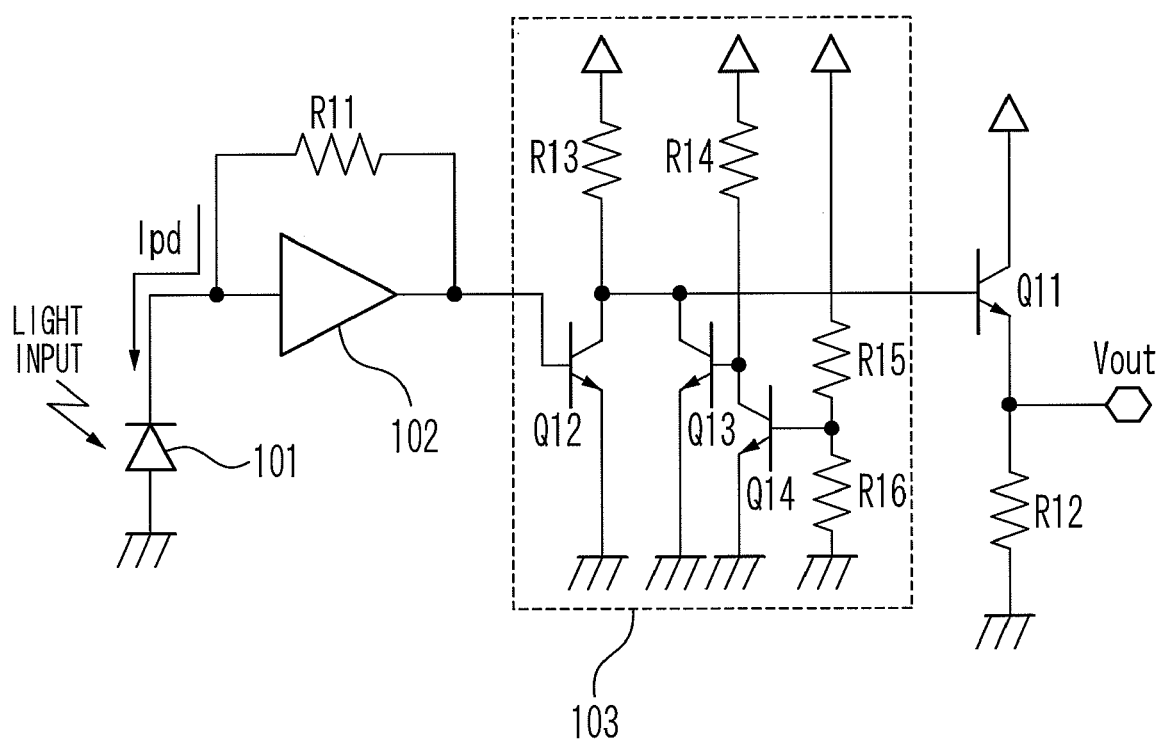
FIG. 6 shows a circuit diagram in a first embodiment.

FIG. 6 is a circuit diagram of an optical receiver and amplifier according to a first embodiment of the present embodiment. The optical receiver and amplifier is realized as an IC (Integrated Circuit) having a current/voltage converting function. The optical receiver and amplifier has an amplifier 102 to which a feedback resistor R11 is connected. A photodiode 101 as a photoelectric conversion element is connected to an input terminal of the amplifier 102. An output current of the photodiode 101 is converted into a photovoltage by the feedback resistor R11. The photovoltage generated through the conversion switches an output transistor Q11 on/off. The output transistor Q11 functions as an output section of the optical receiver and amplifier to generate an output voltage.

A preamplifier including the photodiode 101, the amplifier 102 and the feedback resistor R11 is similar to those in the above-mentioned reference example. The preamplifier functions as a preamplifier section of the optical receiver and amplifier which generates a photovoltage by converting the photocurrent into a voltage by using the power supply voltage, and transmits the photovoltage to the output transistor Q11 via the output control circuit 103 as its input voltage.

The present embodiment is different from the reference example in following points. Firstly, output control circuit 103 is added between an output of the amplifier 102 and the output transistor Q11. Secondly, an open collector output is changed to an emitter follower including the output transistor Q11 and a pull-down resistor R12.

The output control circuit 103 includes a combination of a first grounded emitter amplifier circuit in which a transistor Q12 and a transistor Q13 whose respective collectors are common with each other and a resistor R13 is connected between the common collector node and the power supply, a second grounded emitter amplifier circuit in which a resistor R14 is connected between the collector of a transistor Q14 and the power supply and a resistance voltage dividing circuit in which a voltage is divided between the power supply and GND by a resistor R15 and a resistor R16.

Figure 7A:
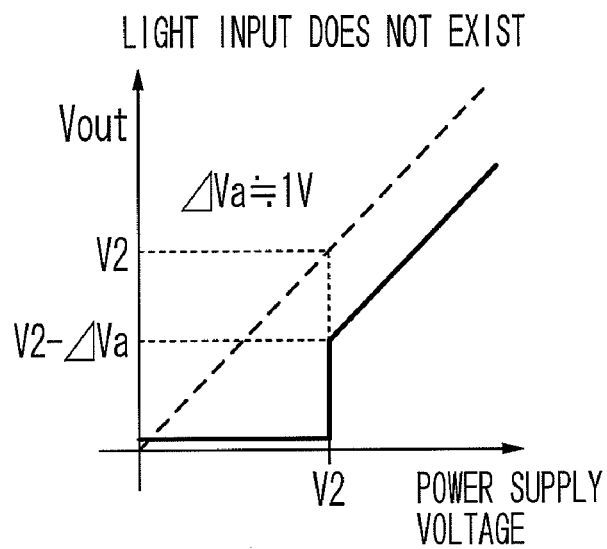
FIG. 7A shows an output characteristic in a first embodiment.
Figure 7B:
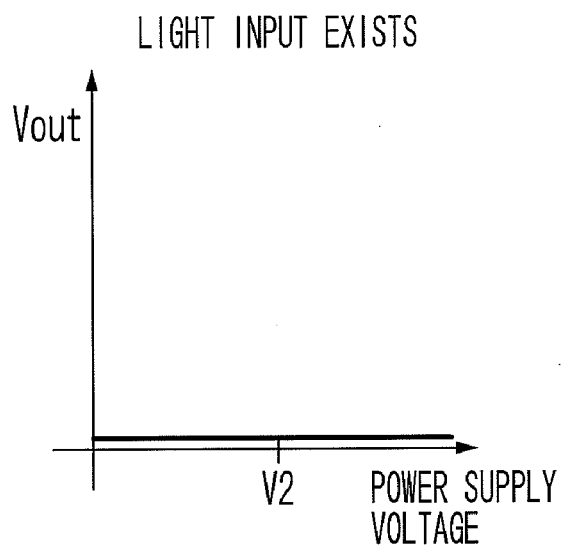
FIG. 7B shows an output characteristic in a first embodiment.

An operation will be described referring to FIG. 6 which is a circuit diagram of this embodiment, and FIGS. 7A and 7B showing relationship between the power supply voltage and the output Vout in the circuit shown in FIG. 6.

When no light input exists or the magnitude of the light input (or equally, the photocurrent outputted by the preamplifier) is small relative to a certain threshold level, the output of the amplifier 102 is at the low level as in the case of the reference example. Here, the threshold power supply voltage V2 shown in the graph of FIG. 7A is determined by the resistance voltage dividing circuit including the resistors R15 and R16 as follows.

$V2=\{(VBE\_Q14)\times(R15+R16)/R16\}$

When the power supply voltage is higher than the threshold power supply voltage V2, since the collector of the transistor Q14 is at the low impedance and the base input of the transistor Q13 is at the low level, the transistor Q13 is put into an OFF state. Thus, both of the transistors Q12 and Q13 are in the OFF state and their collectors are at the high impedance. Consequently, as shown in the graph of FIG. 7A, the output Vout is the high-level output voltage which follows the power supply via the emitter follower and the resistor R13.

Next, when the power supply voltage is lower than the threshold power supply voltage V2 shown in the graph of FIG. 7A, since the collector of the transistor Q14 is at the high impedance and the base input of the transistor Q13 is at the high level, the transistor Q13 is put into the ON state. Thus, the transistor Q12 is in the OFF state, the transistor Q13 is the ON state and its collector is at the low impedance. Since the transistor Q11 is in the OFF state at this time, the output Vout is GND, that is, the low-level output via the pull-down resistor R12 as shown in the graph of FIG. 7A.

When the light input is large relative to a certain threshold level, the output of the amplifier 102 is at the high level as in the case of the reference example. Here, when the power supply voltage is higher than the threshold power supply voltage V2 shown in the graph of FIG. 7B, since the collector of the transistor Q14 is at the low impedance and the base input of the transistor Q13 is at the low level, the transistor Q13 is put into the OFF state. Thus, the transistor Q12 is in the ON state, the transistor Q13 is in the OFF state and its collector is at the low impedance. Since the transistor Q11 is in the OFF state, the output Vout is GND, that is, the low-level output via the pull-down resistor R12 as shown in the graph of FIG. 7B.

Next, when the power supply voltage is lower than the threshold power supply voltage V2 shown in the graph of FIG. 7B, since the collector of the transistor Q14 is at the high impedance and the base input of the transistor Q13 is at the high level, the transistor Q13 is put into the ON state. Thus, both of the transistor Q12 and the transistor Q13 are in the ON state and their collectors are at the low impedance. Since the transistor Q11 is in the OFF state at this time, the output Vout is GND, that is, the low-level output via the pull-down resistor R12 as shown in the graph of FIG. 7B.

As described above, in circuits in this embodiment, a desired threshold power supply voltage V2 can be set by the resistance voltage dividing circuit including the resistors 15 and the resistor 16. When the power supply voltage is lower than the threshold power supply voltage V2, regardless of the presence or absence of the light input, the output Vout can be completely fixed at the low level.

That is, it is possible to provide the function of turning off the output (=low level) as an application of a photocoupler at a certain power supply voltage or lower at the timing of turning on or off of the power supply. By setting V2 to the prescribed power supply voltage of the logic function block or lower, after passage through the INV, the low-level output can be stably obtained in the absence of the light input and the high-level output can be stably obtained in the presence of the light input. Thereby, without additionally providing a control circuit for preventing malfunction of the subsequent stage of the photocoupler, which is required in the case of the aforementioned reference example, the demand for prevention of malfunction in subsequent stages of the circuit can be satisfied.

As described above, an optical receiver and amplifier of a photocoupler having a function capable of satisfying requirements can be realized by adding an output control circuit with a new configuration between a preamplifier part including a photodiode, an amplifier and a feedback resistor, and an output transistor and making the output transistor to have an emitter follower configuration.

Since the output control circuit can set the output voltage of the output transistor to the low level during a period where the power supply voltage is lower than a predetermined value (V2) regardless of the presence or absence of the light output, it is not necessary to additionally provide a control circuit for preventing malfunction.

Second Embodiment

Figure 8:
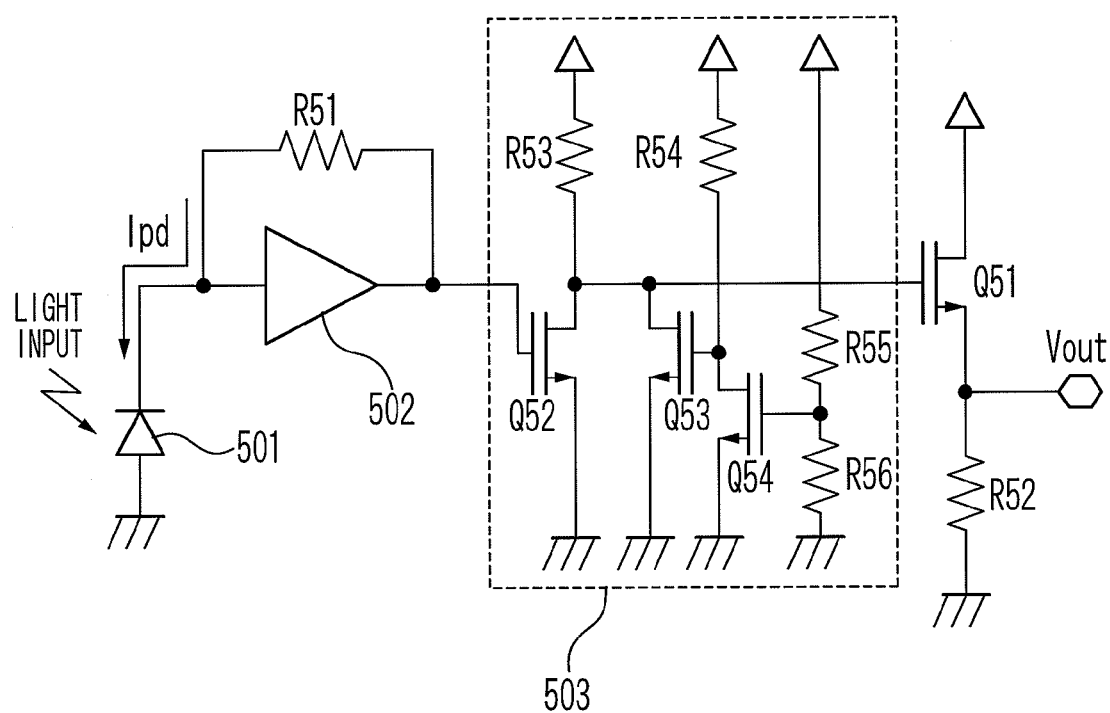
FIG. 8 is a circuit diagram in a second embodiment.

The present invention can also be applied to circuits using MOS transistors. FIG. 8 shows a circuit diagram of this embodiment using MOS transistors. In FIG. 8, the NPN transistors Q11, Q12, Q13, and Q14 in FIG. 6 are replaced with the NMOS transistors Q51, Q52, Q53, and Q54 respectively. In this embodiment, a source follower is adopted for the output section. The output control circuit includes: a first grounded source amplifier circuit whose source input is the photovoltage generated by the preamplifier; and a second grounded source amplifier circuit whose base input is a divided voltage generated by dividing the power supply voltage. The output of the second grounded source amplifier circuit is inputted to the gate of a transistor connected in parallel with a transistor of the first grounded source amplifier circuit. In this embodiment, same effects to a first embodiment can be achieved.

Third Embodiment

Figure 9:
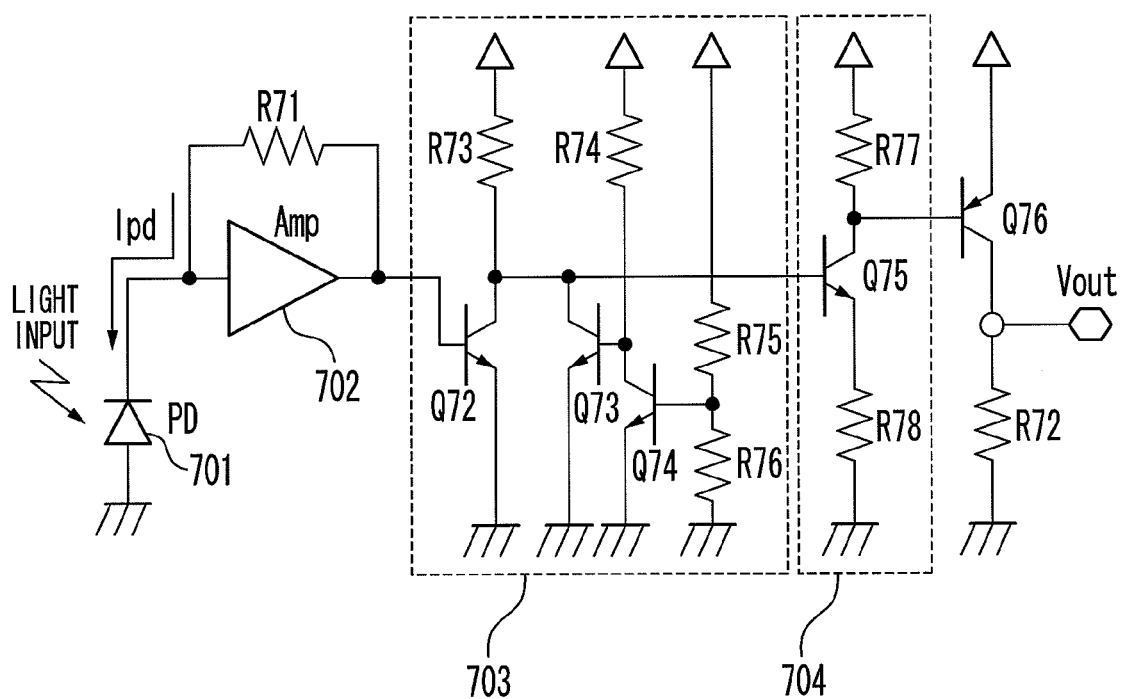
FIG. 9 is a circuit diagram in a third embodiment.

FIG. 9 is a circuit diagram in a third embodiment. In the circuit in this embodiment, as compared to a first embodiment, the output power transistor is replaced with a PNP transistor Q76, and a grounded emitter (common emitter) amplifier circuit 704 including an NPN transistor Q75, resistors R77 and R78 is added.

Regarding to the following components, the circuit in a third embodiment is the same as those in a first embodiment. A light input is converted into a photovoltage by a feedback amplifier. This photovoltage is inputted to a circuit which forcibly obtains a low-level current at a low power supply (including a grounded emitter amplifier circuit including an NPN transistor Q72 and a resistor R73, and NPN transistors Q73 and Q74, resistors R74, R75 and R76).

In a circuit of a third embodiment, as compared to a first embodiment, the output power transistor Q76 is replaced with NPN to PNP. For this reason, the logic needs to be inverted. A grounded emitter amplifier circuit 704 including the NPN transistor Q75 and the resistors R77, R78 functions as an output logic inverting circuit for inverting the logic.

Figure 10A:
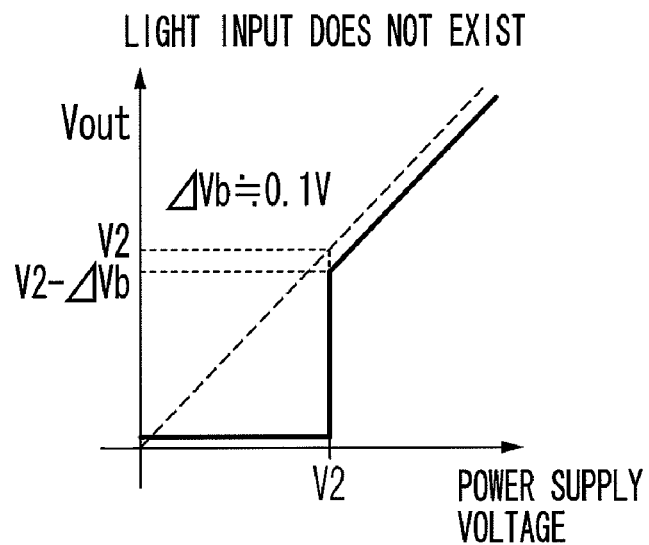
FIG. 10A shows an output characteristic in a third embodiment.
Figure 10B:
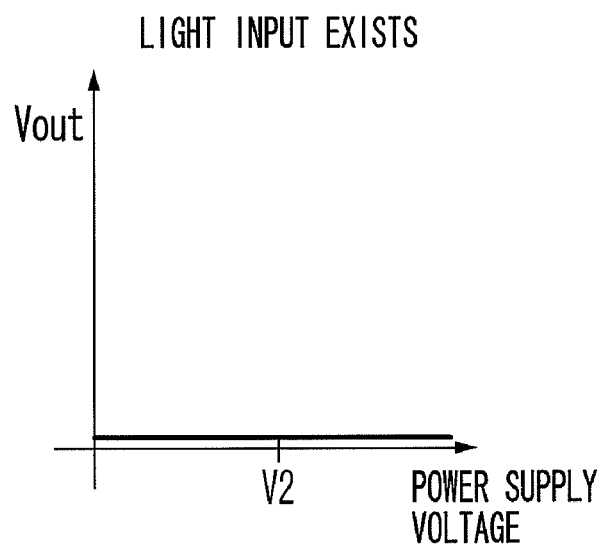
FIG. 10B shows an output characteristic in a third embodiment.

FIGS. 10A and 10B show the relationship between the power supply voltage and the output in this embodiment. FIG. 10A shows an operation at the high-level output (no light input). Since the output of the feedback amplifier is at the low level, the collector output of the transistor Q72, that is, the base input of the transistor Q75 is at the high level. Thereby, the collector output of the transistor Q75, that is, the base input of the transistor Q76 is at the low impedance, the output PNP transistor Q76 is in a saturated driving state. Thus, as shown in FIG. 10A, the value (V2−ΔVb) acquired by subtracting the saturation voltage of Q76 from the power supply voltage is obtained as the high-level output.

FIG. 10B shows an operation at the low-level output (light input exists). Since the output of the feedback amplifier is at the high level, the collector output of the transistor Q72, that is, the base input of the transistor Q75 is at the low level. Thereby, since the collector output of the transistor Q75, that is, the base input of the transistor Q76 is at the high impedance, the output PNP transistor (Q76) is in a cut off state. Thus, as shown in FIG. 10B, the pull-down output is obtained as the low-level output.

In a first embodiment shown in FIGS. 7A and 7B, the output transistor Q11 has the emitter follower configuration. With such a configuration, the output voltage at the high level without light input is lowered from the power supply voltage by a voltage drop in the resistor R13 and the base-emitter voltage of the output transistor Q11 ($\Delta Va \approx 1V$). As a result, the output dynamic range is narrowed. However, with the circuit configuration in a third embodiment, the effect of the output on the power supply voltage is suppressed to only a drop in the collector-emitter saturation voltage ($\Delta Vb \approx 0.1V$). For this reason, as compared to a first embodiment, although the scale of the circuit is increased, the output dynamic range can be enhanced.

Fourth Embodiment

Problem in High-Speed Operation

In a fourth embodiment, an optical receiver and amplifier capable of addressing speeding-up more suitably and a photocoupler using it is provided. To describe functions and effects of a fourth embodiment, the problem which can occur at high speed will be described using a third embodiment as an example.

The circuit in a third embodiment shown in FIG. 9 has an amplifier 702 to which the feedback resistor R71 is connected (configured as a current/voltage converting IC). The photodiode 701 as a photoelectric conversion element is connected to the input terminal of the amplifier 702. The output current of the photodiode 701 is converted into a voltage by the feedback resistor R71. The voltage generated by this conversion switches on/off the output transistor Q76. The output transistor Q76 is a grounded emitter PNP transistor. In other words, the pull-down resistor R72 is connected to the collector of the output transistor Q76.

Output control circuits 703, 704 are provided between an output of the amplifier 702 and the output transistor Q76. The output control circuits 703, 704 include a combination of a grounded emitter amplifier circuit in which the transistor Q72 and the transistor Q73 whose respective collectors are common with each other and the resistor R73 is connected between the common collector and the power supply, a grounded emitter amplifier circuit in which the resistor R74 is connected between the collector of the transistor Q74 and the power supply and a resistance voltage dividing circuit in which a voltage is divided between the power supply and GND by a resistor R75 and a resistor R76. Since the output power transistor Q76 is PNP, the logic is inverted by the grounded emitter amplifier circuit including the NPN transistor Q75 and the resistors R77, R78.

As an application of the photocoupler, the output control circuits 703, 704 can perform an output operation for preventing malfunction of the circuit connected in subsequent stages of the photocoupler at rising or trailing (turning on or off) of the power supply. Specifically, the output is the OFF state (=low level) at a certain voltage or less. Furthermore, since the output transistor Q76 is the grounded emitter PNP transistor, the collector of which is connected to the pull-down resistor R72, the output voltage at the high level is lowered from the power supply voltage by only the drop in the collector-emitter saturation voltage ($\Delta Vb \approx 0.1V$) and thus, the output dynamic range can be enhanced.

First, when no light input exists or the light input is small relative to a certain threshold level, the output of the feedback amplifier is at the low level. For this reason, the collector output of the transistor Q72, that is, the base input of the transistor Q75 is at the high level.

The threshold power supply voltage V2 shown in the graph of FIG. 10A is determined by the resistance voltage dividing circuit including the resistors R75 and R76 as follows:

$$V2 = \{(VBE\_Q74) \times (R75 + R76)/R76\}$$

Here, when the power supply voltage is higher than the threshold power supply voltage V2, since the collector of the transistor Q74 is at the low impedance and the base input of the transistor Q73 is at the low level, the transistor Q73 is in the OFF state. Thus, both of the transistor Q72 and the transistor Q73 are in the OFF state and their collectors are at the high impedance. Thereby, since the collector output of the transistor Q75, that is, the base input of the transistor Q76 are at the low impedance, the output transistor Q76 is in the saturated driving state. Accordingly, as shown in the graph of FIG. 10A, the value (V2–$\Delta$Vb) acquired by subtracting the saturation voltage of the output transistor Q76 from the power supply voltage is obtained as the high-level output.

Next, when the power supply voltage is lower than the threshold power supply voltage V2 shown in the graph of FIG. 10A, since the collector of the transistor Q74 is at the high impedance and the base input of the transistor Q73 is at the high level, the transistor Q73 is put into the ON state. Thus, the transistor Q72 is in the OFF state, the transistor Q73 is in the ON state and its collector is at the low impedance. Since the transistor Q76 is in the OFF state at this time, the output Vout becomes GND via the pull-down resistor R72, that is, the low-level output as shown in the graph of FIG. 10A.

When the light input is higher than a certain threshold level, the output of the amplifier 702 is at the high level. Here, when the power supply voltage is higher than the threshold power supply voltage V2 shown in the graph of FIG. 10B, since the collector of the transistor Q74 is at the low impedance and the base input of the transistor Q73 is at the low level, the transistor Q73 is put into the OFF state. Thus, the transistor Q72 is in the ON state, the transistor Q73 is in the OFF state and the collector is at the low impedance. Since the transistor Q76 is in the OFF state at this time, the output Vout becomes GND via the pull-down resistor R72, that is, the low-level output as shown in the graph of FIG. 10B.

Next, when the power supply voltage is lower than the threshold power supply voltage V2 shown in the graph of FIG. 10B, since the collector of the transistor Q74 is at the high impedance and the base input of the transistor Q73 is at the high level, the transistor Q73 is put into the ON state. Thus, both of the transistors Q72 and Q73 are in the ON state and their collectors thereof are at the low impedance. Since the transistor Q76 is in the OFF state at this time, the output Vout becomes GND via the pull-down resistor R72, that is, the low-level output as shown in the graph of FIG. 10B.

Figure 11:
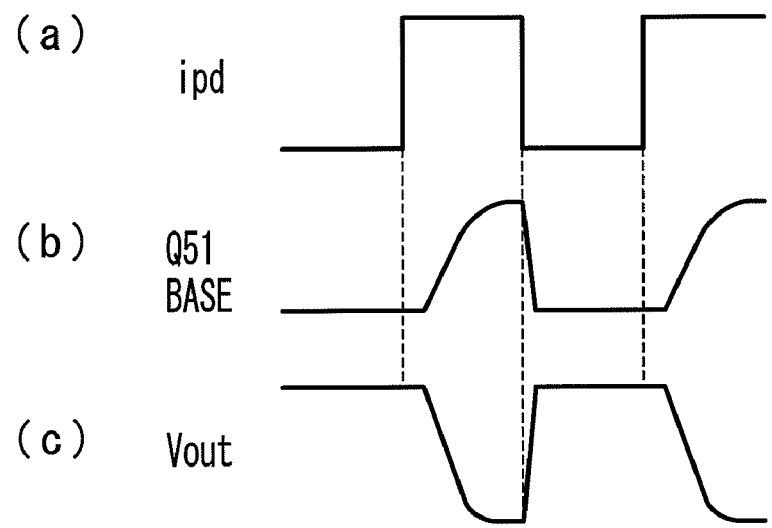
FIG. 11 shows an example of an output characteristic for describing a problem in a fourth embodiment.
Figure 12:
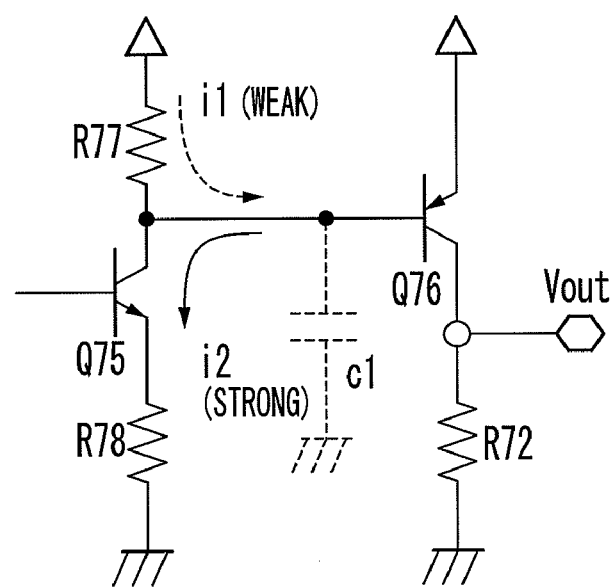
FIG. 12 shows an example of a circuit operation for describing a problem in a fourth embodiment.

In the future, the demand for a photocoupler having more high-speed will be increased. The circuit shown in FIG. 9 has a problem that as the speed is higher, distortion of pulse width at switching is larger as shown in FIG. 11. FIG. 12 shows the output driving in the circuit shown in FIG. 9. A capacitance c1 in FIG. 12 shows a parasitic capacitance on the base line of the output transistor Q76. The capacitance c1 mainly contains base-emitter junction capacitance and base-collector junction capacitance of the output transistor Q76, which are increased due to the mirror effect. In considering switching speed, the effect of the capacitance c1 can not be neglected. In the circuit in FIG. 9, when the capacitance c1 is charged, the charging speed is determined depending on the current i1 shown in FIG. 12. Since the current i1 is determined by the resistor R77, the charging capacity to rapid following is weak. On the other hand, when the capacitance c1 is discharged, the discharging speed is determined depending on the current i2 shown in FIG. 12. Since the current i2 is determined by the transistor Q75, the discharging capacity to the rapid following is high.

In the circuit shown in FIG. 9, as described above, since the switching capacity to the rapid following of the output transistor Q76 at switching from high to low is different from that of at switching from low to high, distortion of pulse width becomes large as shown in FIG. 11.

Configuration of Fourth Embodiment

The optical receiver and amplifier and the photocoupler in a fourth embodiment has the function of satisfying the demand for speeding-up by adding a comparator circuit between the output transistor and a part having the preamplifier part including the photodiode, the amplifier and the feedback resistor.

By performing an active operation at both turn-on and turn-off of the output transistor, the comparator circuit can rapidly charge and discharge the capacitance on the base line of the output transistor. By increasing switching speed of the output transistor in this manner, distortion of pulse width at switching is improved, thereby addressing speeding-up.

Figure 13:
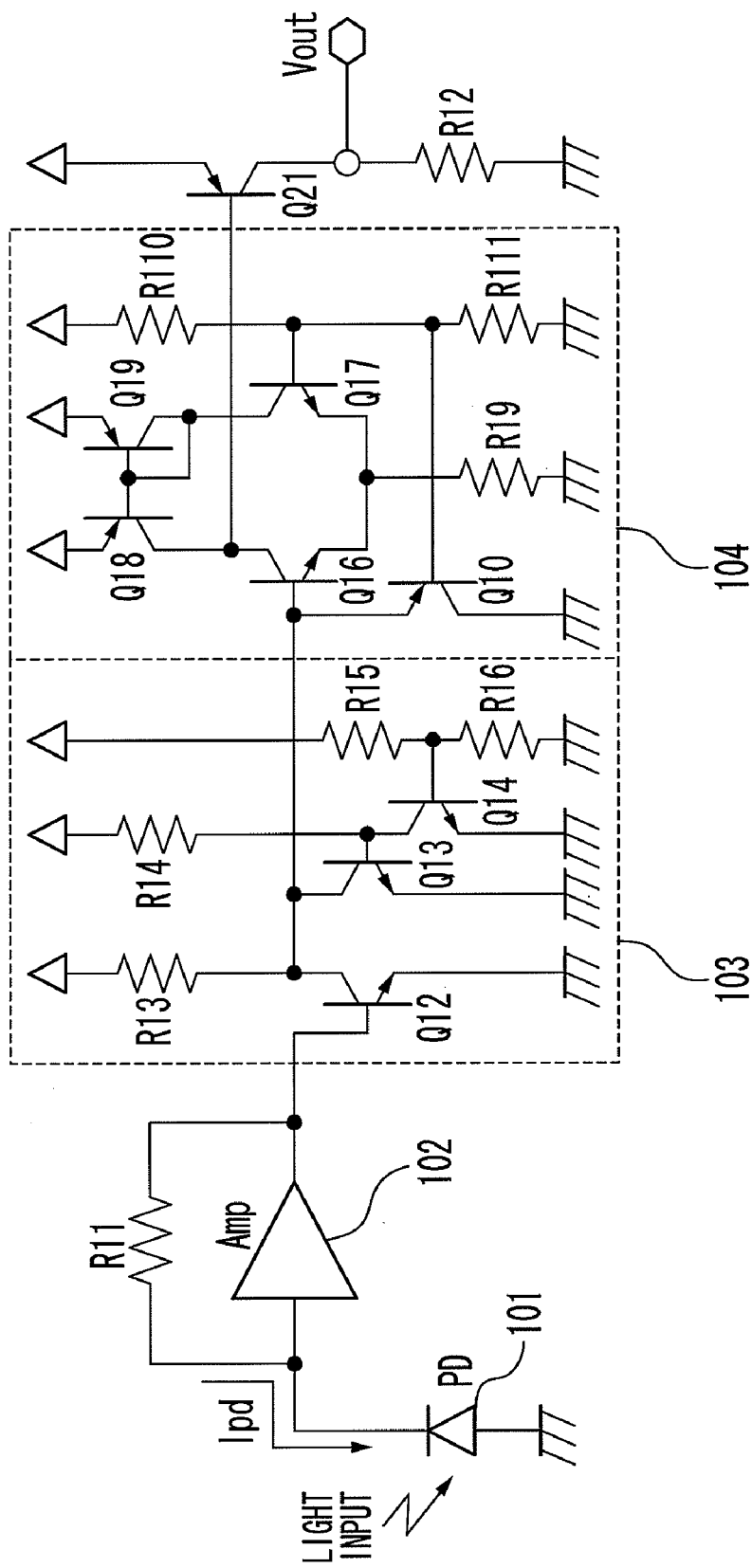
FIG. 13 is a circuit diagram in a fourth embodiment.

FIG. 13 is a circuit diagram of the optical receiver and amplifier in a fourth embodiment. The circuit in FIG. 13 has an amplifier 102 to which the feedback resistor R11 is connected. The photodiode 101 which is a photoelectric converting element is connected to the input terminal of the amplifier 102. The output current generated in response to the light received by the photodiode 101 is converted into a voltage by the feedback resistor R11. By operating the comparator added in the present embodiment at the voltage generated by conversion of the current in the current/voltage converting IC, an output transistor Q21 is switched on/off.

The preamplifier including the photodiode 101, the amplifier 102 and the feedback resistor R11 and the output control circuit 103 have the same configuration as those in a third embodiment respectively. The added or changed parts in a fourth embodiment are as follows: (1) the comparator circuit 104 is newly added to a position between the output control circuit 103 and the output transistor Q21; and (2) the transistor Q75 and the resistors R77, R78 which compose an inverting circuit in the output control circuit 703 in a third embodiment shown in FIG. 9 are omitted.

The configuration of the comparator circuit 104 will be described. A first NPN transistor Q16 is connected to a second NPN transistor Q17 so as to have a common emitter. A resistor R19 is connected between the common emitter and the GND terminal. The collector of the NPN transistor Q16 is connected to the collector of a PNP transistor Q18, and the collector of the NPN transistor Q17 is connected to the collector of a PNP transistor Q19. PNP transistors Q18 and Q19 are connected to each other so as to have a common base. The emitter of each of the PNP transistors Q18, Q19 is connected to power supply terminals. The base and the collector of the PNP transistor Q19 are connected to each other. With such connections, the PNP transistors Q18 and Q19 forms a current mirror circuit. The current mirror circuit functions as an active load. The active load and the NPN transistors Q16, Q17 forms the comparator.

A resistor R110 is connected between the power supply terminal and the base of the NPN transistor Q17. A resistor R111 is connected between the GND terminal and the base of the NPN transistor Q17. The resistors R110, R111 forms a threshold voltage generation section for generating the threshold voltage which determines whether the output transistor Q21 is switched on or off. The base of the NPN transistor Q17 is connected to the base of the PNP transistor Q10. The collector of the PNP transistor Q10 is connected to the GND terminal and the emitter of the PNP transistor Q10 is connected to the base of the NPN transistor Q16. The output of the output control circuit 103 is input to the base of the NPN transistor Q16. The base of the output transistor Q21 is connected to the junction of the collector of each of the NPN transistor Q16 and the PNP transistor Q18.

Operation in Fourth Embodiment

Figure 14A:
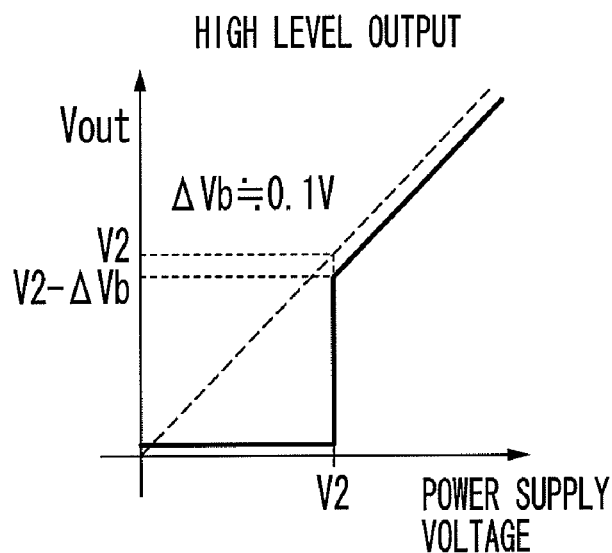
FIG. 14A shows an output characteristic in a fourth embodiment.
Figure 14B:
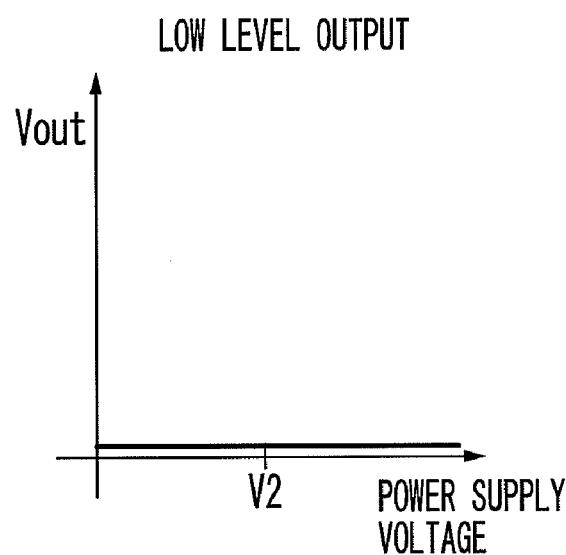
FIG. 14B shows an output characteristic in a fourth embodiment.

An operation will be described referring to the circuit diagram of a fourth embodiment shown in FIG. 13 and FIGS. 14A, 14B showing the relationship between the power supply voltage and the output Vout in the circuit in FIG. 13.

A current generated in response to the light input is converted into a voltage signal by the feedback amplifier. After that, the signal passes the circuit including the output control circuit 103 which forcibly obtains the low-level output at the low power supply. Up to this, the operation is the same as in the circuit in a third embodiment.

When the light input which turns on the transistor Q12 in the output control circuit 103 is not fed, the collector output of the transistor Q12 is at the high impedance and the comparator input transistor Q16 is turned on. For this reason, the base input of the output transistor Q21 is at the low impedance. Thus, the output transistor Q21 is turned on and the output transistor Q21 is saturated at this time. Accordingly, an output potential (V2−ΔVb shown in FIG. 14A) obtained by subtracting the collector-emitter saturation voltage of the output transistor Q21 from the power supply voltage is acquired as the output voltage Vout. Here, ΔVb represents the collector-emitter saturation voltage of the output transistor Q21. At this time, as in the circuit in a third embodiment, when the power supply voltage is the threshold voltage V2 or lower, the output forcibly becomes the low-level output.

On the other hand, when the light input which turns on the transistor Q12 in the output control circuit 103 is fed, the collector output of the transistor Q12 is at the low impedance and the comparator input transistor Q16 is turned off. For this reason, the base input of the output transistor Q21 is at the high impedance. Accordingly, the output transistor Q21 is in the OFF state and the output potential of the low level pulled down by the resistor R12 is obtained as the output voltage Vout. Therefore, with the circuit configuration shown in FIG. 13, same output variation characteristics as those in a third embodiment can be obtained.

The threshold voltage of the comparator circuit can be set to any desirable value by the resistors R110 and R111 and the driving current of the comparator is determined by the resistor R19. The transistor Q10 also functions as a limiter for limiting the input amplitude.

Figure 15:
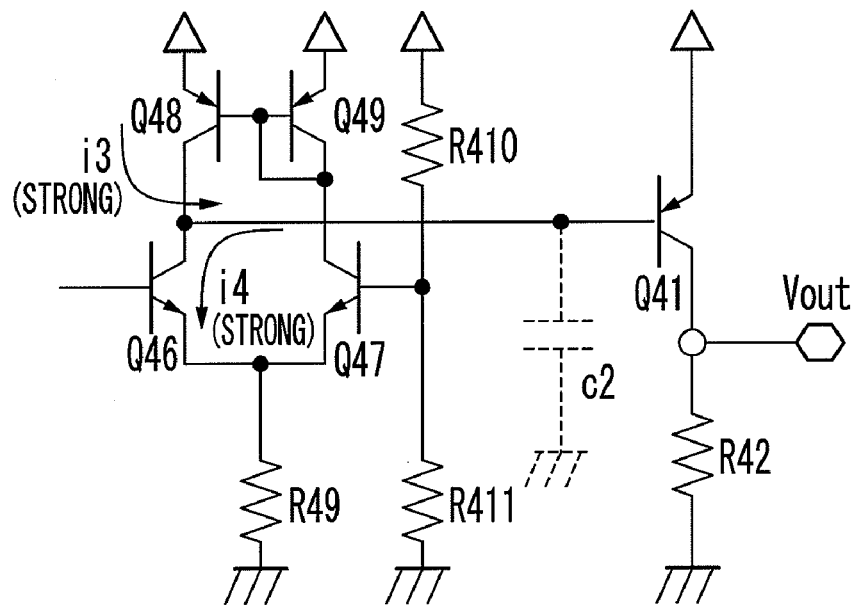
FIG. 15 is a circuit diagram for describing an operation in a fourth embodiment.

FIG. 15 shows output driving of the circuit according to this embodiment of the present invention. A capacitance c2 in FIG. 15 shows a parasitic capacitance on the base line of the output transistor Q41. The capacitance c2 mainly contains the base-emitter junction capacitance and the base-collector junction capacitance of the output transistor Q41, which are increased due to the mirror effect. In turning on/off of the output transistor Q41, it is required to electrically charging and discharging the capacitance c2, and the switching speed of the output waveform is determined depending on the charging/discharging speed.

In the circuit in a fourth embodiment, when charging the capacitance c2, the charging speed is determined depending on the current i3 shown in FIG. 15. Since the current i3 is determined according to an active load Q48, the charging capacity to the rapid following is high. On the other hand, when discharging the capacitance c2, the discharging speed is determined depending on the current i4 shown in FIG. 15. Since the i4 is determined by the transistor Q46, the discharging capacity to the rapid following is high.

Figure 16:
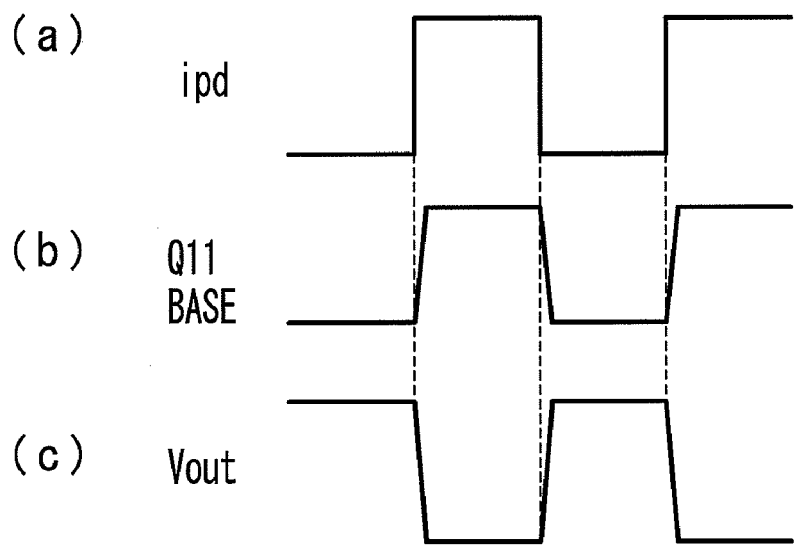
FIG. 16 shows an output waveform in a fourth embodiment.

Thus, in the circuit in a fourth embodiment, by enhancing both of the charging and discharging by transistor driving, the imbalance in the switching capacity to the rapid following of the output transistor Q41 between at switching from high to low and switching from low to high can be prevented. As a result, as shown in FIG. 16, the distortion of the pulse width is improved.

In addition, by performing a limitation for preventing an excessive input waveform by a strong input from being inputted to the comparator circuit by use of the transistor Q10, delay of switching due to a strong input can be prevented.

In a fourth embodiment, in a system having a photocoupler, switching speed can be increased to address further speeding-up while satisfying following requirements:

(a) There is no need to additionally provide a control circuit dedicated for preventing malfunction.

(b) To realize a simple system configuration and low costs, the function of preventing malfunction of the system at turn-on and turn-off of the power supply is included within the photocoupler.

Fifth Embodiment

Figure 17:
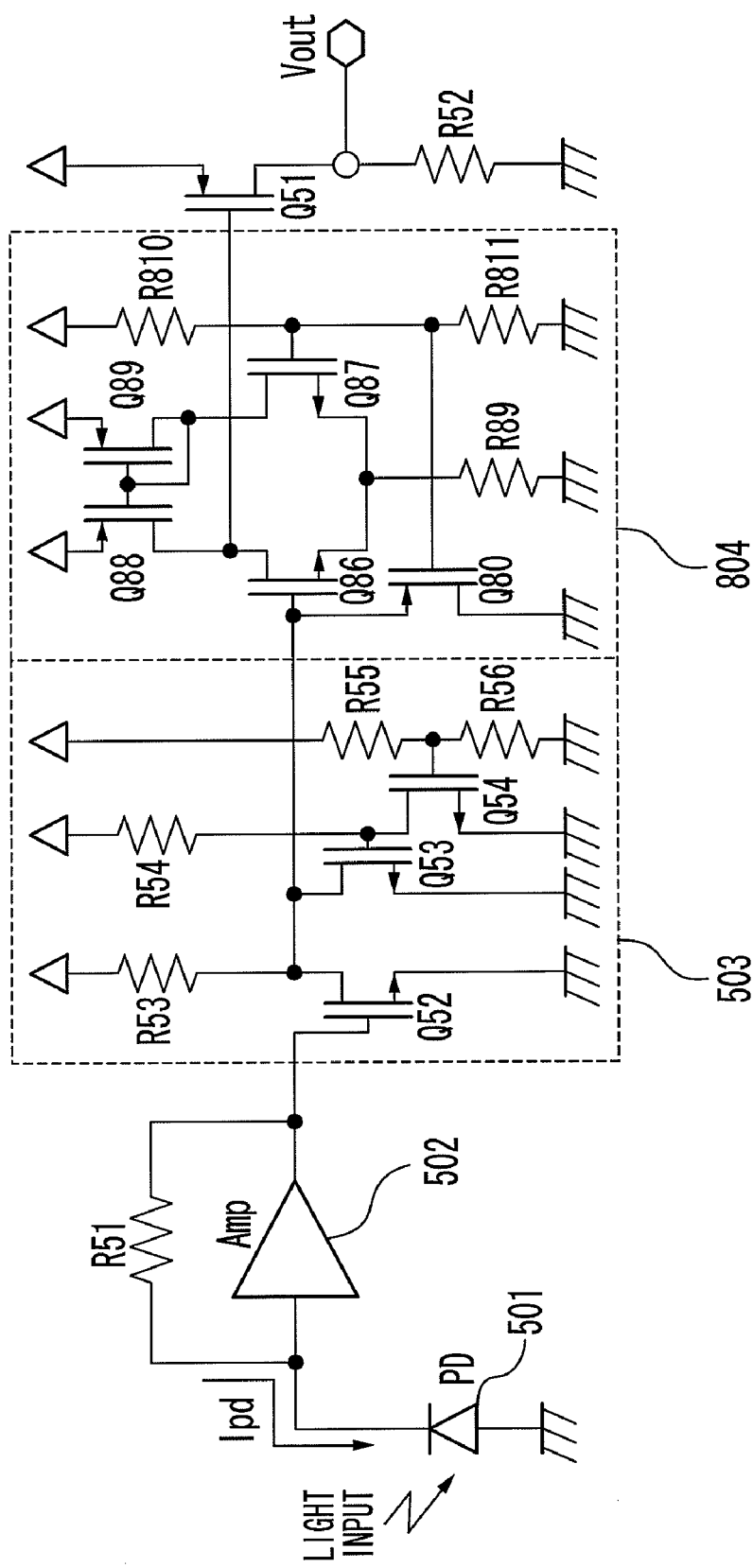
FIG. 17 is a circuit diagram in a fifth embodiment.

In a fifth embodiment, MOS transistors are replaced with bipolar transistors in a fourth embodiment. FIG. 17 is a circuit diagram of a fifth embodiment using MOS transistors. The circuit in FIG. 17 is different from the circuit in FIG. 13 in the following points. (1) The NPN transistors Q12, Q13, Q14 in the output control circuit 103 are replaced with the NMOS transistors Q52, Q53, Q54 in the output control circuit 803. (2) The NPN transistors Q16, Q17 and the PNP transistors Q10, Q18, Q19 in the comparator circuit 104 are replaced with the NMOS transistors Q86, Q87 and PMOS transistors Q80, Q88, Q89 in the comparator circuit 104. (3) The PNP transistor Q21 is replaced with the PMOS transistor Q81 in the output transistor. This circuit can achieve the same effects as the circuit shown in FIG. 13.

By using any of the above-mentioned optical receiver and amplifiers in first to fifth embodiments as the optical receiver and amplifier 904, the photocoupler as shown in FIG. 1 can be configured.

Although in the above-mentioned first to fifth embodiments, the anode of each of the photodiodes 101, 501, 701 is grounded, similar effects can be obtained by connecting each cathode to the power supply.

According to a system having the photocoupler in the above-mentioned embodiments, by including the function of preventing malfunction of the system at turn-on and turn-off of power supply within the photocoupler, there is no need to additionally provide a control circuit for preventing malfunction. For this reason, a simple system configuration and low costs can be realized.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. An optical receiver and amplifier comprising:
a photodiode configured to generate a photocurrent in response to a light input;
an output section configured to output an output voltage being a low level or a high level in response to a magnitude of the photocurrent by using a power supply voltage supplied from a power supply;
an output control circuit configured to control an input voltage of the output section such that the output voltage is set to the low level when the power supply is turned on or off during a period where the power supply voltage is lower than a predetermined value;
a preamplifier section configured to generate a photovoltage by converting the photocurrent into a voltage by using the power supply voltage,
wherein:
the output control circuit is configured to output the input voltage of the output section for controlling the output voltage based on the photovoltage,
the output section is configured to have a transistor arranged to be an NPN emitter follower or a source follower, and
the output control circuit comprises:
a first grounded emitter amplifier circuit whose base input is the photovoltage generated by the preamplifier section; and
a second grounded emitter amplifier circuit whose base input is a divided voltage generated by dividing the power supply voltage,
wherein an output of the first grounded emitter amplifier circuit is inputted to the output section as the input voltage, and
an output of the second grounded emitter amplifier circuit is inputted to a transistor connected in parallel with a transistor of the first grounded emitter amplifier circuit.

2. The optical receiver and amplifier according to claim 1, wherein the divided voltage is generated by a resistance division between the power supply and a ground.

3. The optical receiver and amplifier according to claim 1, further comprising:
a comparator circuit connected between the output control circuit and the output section and configured to actively control a switching of the transistor in the output section arranged to be the NPN emitter follower or the source follower.

4. The optical receiver and amplifier according to claim 3, wherein the comparator circuit comprises:
a current mirror circuit formed by PNP transistors;
a pair of transistors to which the current mirror circuit is applied as an active load;
a threshold voltage generation section configured to generate a threshold voltage for determining on or off of the switching; and
a PNP transistor arranged to limit the output voltage outputted by the output control circuit,
wherein the pair of transistors comprises:
a first NPN transistor to which the output voltage outputted by the output control circuit is inputted; and
a second NPN transistor connected to have a common emitter with the first NPN transistor.

5. The optical receiver and amplifier according to claim 3, wherein the comparator circuit comprises:
a current mirror circuit formed by PMOS transistors;
a pair of transistors to which the current mirror circuit is applied as an active load;
a threshold voltage generation section for determining on or off of the switching; and
a PMOS transistor arranged to limit the output voltage outputted by the output control circuit,
wherein the pair of transistors comprises:
a first NMOS transistor to which the output voltage outputted by the output control circuit is inputted; and
a second NMOS transistor connected to have a common source with the first NMOS transistor.

6. The optical receiver and amplifier according to claim 4, wherein the threshold voltage generation section has dividing resistors for dividing a voltage between a power supply and a ground to generate the threshold voltage.

7. A photocoupler comprising:
a light emitting diode configured to convert an input electric signal into an optical signal; and
the optical receiver and amplifier according to claim 1 configured to receive the optical signal as the light input.

8. An optical receiver and amplifier comprising:
a photodiode configured to generate a photocurrent in response to a light input;
an output section configured to output an output voltage being a low level or a high level in response to a magnitude of the photocurrent by using a power supply voltage supplied from a power supply;
an output control circuit configured to control an input voltage of the output section such that the output voltage is set to the low level when the power supply is turned on or off during a period where the power supply voltage is lower than a predetermined value;
a preamplifier section configured to generate a photovoltage by converting the photocurrent into a voltage by using the power supply voltage,
wherein:
the output control circuit is configured to output the input voltage of the output section for controlling the output voltage based on the photovoltage,
the output section is configured with a source follower circuit, and
the output control circuit comprises:
a first grounded source amplifier circuit whose source input is the photovoltage generated by the preamplifier section; and
a second grounded source amplifier circuit whose base input is a divided voltage generated by dividing the power supply voltage,
wherein an output of the second grounded source amplifier circuit is inputted to a gate of a transistor connected in parallel with a transistor of the first grounded source amplifier circuit.

9. A photocoupler comprising:
a light emitting diode configured to convert an input electric signal into an optical signal; and
the optical receiver and amplifier according to claim 8 configured to receive the optical signal as the light input.

10. An optical receiver and amplifier comprising:
a photodiode configured to generate a photocurrent in response to a light input;
an output section configured to output an output voltage being a low level or a high level in response to a magnitude of the photocurrent by using a power supply voltage supplied from a power supply;
an output control circuit configured to control an input voltage of the output section such that the output voltage is set to the low level when the power supply is turned on or off during a period where the power supply voltage is lower than a predetermined value;
an output logic inversion circuit; and
a preamplifier section configured to generate a photovoltage by converting the photocurrent into a voltage by using the power supply voltage, and transmit the photovoltage to the output section via the output control circuit and the output logic inversion circuit as the input voltage,
wherein:
the output section is configured to be a PNP emitter follower,
the output control circuit comprises a first grounded emitter amplifier circuit whose base input is the photovoltage generated by the preamplifier section,
an output of the first grounded emitter amplifier circuit is inputted to a base of the output logic inversion circuit, and
an output of the output logic inversion circuit is inputted to the output section as the input voltage.

11. A photocoupler comprising:
a light emitting diode configured to convert an input electric signal into an optical signal; and
the optical receiver and amplifier according to claim 10 configured to receive the optical signal as the light input.

* * * * *